(12) United States Patent
Duda et al.

(10) Patent No.: US 11,606,156 B1
(45) Date of Patent: Mar. 14, 2023

(54) CLOCK SYNCHRONIZATION

(71) Applicant: Acacia Communications, Inc., Maynard, MA (US)

(72) Inventors: James Duda, Waltham, MA (US); Jon Stahl, Wayland, MA (US); Kevin Hinchey, Marlborough, MA (US)

(73) Assignee: Acacia Communications, Inc., Maynard, MA (US)

( * ) Notice: Subject to any disclaimer, the term of this patent is extended or adjusted under 35 U.S.C. 154(b) by 0 days.

(21) Appl. No.: 16/857,584

(22) Filed: Apr. 24, 2020

Related U.S. Application Data

(60) Provisional application No. 62/838,859, filed on Apr. 25, 2019.

(51) Int. Cl.
*H04B 10/00* (2013.01)
*H04J 3/06* (2006.01)
*H03L 7/081* (2006.01)
*H04L 43/106* (2022.01)

(52) U.S. Cl.
CPC .......... *H04J 3/0697* (2013.01); *H03L 7/0814* (2013.01); *H04J 3/0661* (2013.01); *H04L 43/106* (2013.01)

(58) Field of Classification Search
CPC .............................. H04J 3/0661; H04L 43/106
See application file for complete search history.

(56) References Cited

U.S. PATENT DOCUMENTS

| | | | | |
|---|---|---|---|---|
| 5,070,754 | A * | 12/1991 | Adamson | G10G 7/02 |
| | | | | 84/454 |
| 8,374,291 | B1 * | 2/2013 | Himsoon | H04L 27/22 |
| | | | | 375/343 |
| 9,337,934 | B1 * | 5/2016 | Agazzi | H04B 10/61 |
| 9,735,881 | B1 * | 8/2017 | Agazzi | H04B 10/61 |
| 10,177,851 | B2 * | 1/2019 | Agazzi | H04B 10/516 |
| 10,491,304 | B2 * | 11/2019 | Agazzi | H04B 10/61 |
| 10,742,327 | B2 * | 8/2020 | Agazzi | H04B 10/61 |
| 2007/0248153 | A1 * | 10/2007 | Polk, Jr. | H04L 12/66 |
| | | | | 375/222 |
| 2012/0261274 | A1 * | 10/2012 | Rearick | G16B 30/00 |
| | | | | 205/789 |
| 2013/0231870 | A1 * | 9/2013 | Sugnet | H03M 7/30 |
| | | | | 702/19 |
| 2014/0294052 | A1 * | 10/2014 | Currivan | H04L 27/2613 |
| | | | | 375/224 |
| 2015/0220472 | A1 * | 8/2015 | Sengoku | G06F 13/4068 |
| | | | | 375/340 |
| 2016/0112214 | A1 * | 4/2016 | Currivan | H04L 27/2605 |
| | | | | 375/222 |
| 2017/0063569 | A1 * | 3/2017 | Currivan | H04L 27/2613 |
| 2017/0317759 | A1 * | 11/2017 | Agazzi | H04L 7/0075 |
| 2018/0035256 | A1 * | 2/2018 | Prevatt | G01S 5/14 |
| 2019/0305854 | A1 * | 10/2019 | Campos | H04B 10/61 |

FOREIGN PATENT DOCUMENTS

| | | | | |
|---|---|---|---|---|
| WO | WO-9003638 | A1 * | 4/1990 | ............... G10G 7/02 |
| WO | WO-2008138047 | A1 * | 11/2008 | ....... H04N 21/64322 |
| WO | WO-2015053907 | A1 * | 4/2015 | ......... G06F 13/4295 |

* cited by examiner

*Primary Examiner* — Jay P Patel

(57) ABSTRACT

A method, system, and apparatus for determining delay between clocks, in response to a trigger event, buffering DSP symbol information in a symbol capture buffer; wherein the amount of DSP symbol information buffered corresponds to the amount of symbols captured during a buffer storage interval; and extracting a synchronization packet from the symbol capture buffer.

20 Claims, 10 Drawing Sheets

CLOCK SYNCHRONIZATION

RELATED APPLICATIONS AND PRIORITY CLAIM

The present application claims the benefit under 35 U.S.C. § 119(e) of U.S. Provisional Patent Application Ser. No. 62/838,859 filed Apr. 25, 2019 entitled "Clock Synchronization," which is hereby incorporated herein by reference in its entirety.

BACKGROUND

Often different components of a system may have clocks.

SUMMARY

Figure 1:
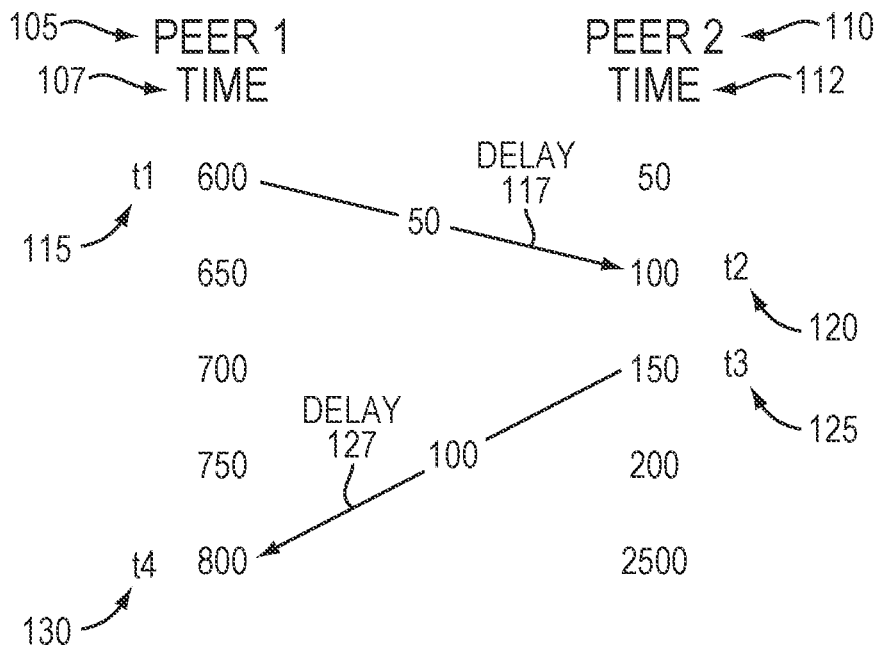
FIGS. 1-3 are simplified example illustrations of unsuccessful clock synchronization between two peers, according to embodiments of the current disclosure.

A method, system, and apparatus for determining delay between clocks, in response to a trigger event, buffering DSP symbol information in a symbol capture buffer; wherein the amount of DSP symbol information buffered corresponds to the amount of symbols captured during a buffer storage interval; and extracting a synchronization packet from the symbol capture buffer.

DETAILED DESCRIPTION

In some embodiments, a communication system may transmit data from a transmitter to a receiver over a communication link. In many embodiments, a transmitter and a receiver may each have a clock. In almost all embodiments, it may be beneficial for a clock at a transmitter and a clock at a receiver to be synchronized.

In many embodiments, a communication link may be exposed to environmental conditions that may interfere with data transmitted over a communication link. In certain embodiments, a way to correct for interference over a communication link may be to use an encoder on a transmission side of a communication link. In most embodiments, a way to correct for interference over a communication link may be to use a decoder on a receiver side of a transmission link. In almost every embodiment, each piece of circuitry or optics of a transmitter or a receiver may add delay to a communication system, where such delay may not be symmetrical between transmitter and receiver and may not be constant over time. In almost all embodiments, the current disclosure may include techniques to synchronize clocks in a communication system accounting for different delays within the communication system.

In some embodiments, the following terminology may be useful in understanding the application and the claims. In certain embodiments, ASIC may mean Application Specific Integrated Circuit. In some embodiments, a DSP may be a Digital Signaling Processor. In many embodiments, FEC may mean Forward Error Correction. In some embodiments, FLEXO may mean Flexible Optical Interface. In certain embodiments, GIGE may mean Gigabit Ethernet module. In some embodiments, OTN may mean Optical Transport Network. In many embodiments, OTUC may mean Optical Transport Unit for beyond 100G. In certain embodiments herein, OTUC may be used interchangeably with ODUC. In many embodiments, RX may mean a path from the Line side (optical) interface to the Client side (electrical) interface. In some embodiments, TX: path from the Client side (electrical) interface to the Line side (optical) interface.

In many embodiments, an ASIC may refer to a chip which provides a Client and DSP Modem functionality. In certain embodiments, a Host may identify user logic that controls an ASIC. In certain embodiments, data may interface from a Host and may be called Client interfaces. In many embodiments, client interfaces may contain logic that is responsible for processing Ethernet and OTN interfaces. In some embodiments, an interface to an optical network may be called a Line interface. In many embodiments, a path from a Client to a Line may be is called a transmit path (TX). In certain embodiments, a path from a Line to a Client may be called a receive path (RX).

Conventionally, an IEEE-1588-2008-v2 standard is used to propagate the time of day clock between peers in a network (PTP protocol). In many embodiments, the current disclosure has realized that there may be problems with this IEEE standard. In certain embodiments, this IEEE standard may not be able to correctly determine clock delay.

Refer now to the example embodiment of FIG. 1, which illustrates determining a delay time between two peers. In this example embodiment there are two peers, Peer 1 105 and Peer 2 110. Peer 1 105 is the timing master and has the correct time. Peer 2 110 does not have the correct time and needs to be synchronized with Peer 1 105. In this diagram both Peer 1 105 and Peer 2 110 have their own notion of Time, shown in the Time columns 107 and 112.

In this example embodiment, the transmission delay from Peer 1 105 to Peer 2 110 is 50 Time units as shown by delay 117. The transmission delay from Peer 2 110 to Peer 1 105 is 100 Time units as shown by delay 127. In this example embodiment, the transmission delays between the two peers is not symmetrical.

A synchronization process of this embodiment requires sending of a Precision Time Protocol (PTP) packet called Pdelay_Req from Peer 1 105 to Peer 2 110. The Pdelay_Req contains the time stamp from Peer 1 105 coincident to when the packet is delivered to the wire for transmission. The Peer 1 105 Time for the transmission of the Pdelay_Req packet is labeled t1 115 in the diagram. When Peer 2 110 receives the Pdelay_Req packet, Peer 2 110 records the time the packet is received by sampling its own time of day clock coincident to when the packet is pulled for the line. The received time is stored in t2 120.

Peer 2 110 will respond to Peer 1 105 with a Pdelay_Resp packet. The Pdelay_Resp packet contains the Peer 2 110 Time coincident to when the Pdelay_Resp packet is delivered to the wire for transmission. This time is stored in t3 125. When Peer 1 105 receives the Pdelay_Resp packet, Peer 1 105 records the time the packet is received by sampling its own time of day clock coincident to when the packet is pulled from the line. The received time is stored in t4 130.

After Pdelay_Resp packet is received, Peer 1 105 has information necessary to calculate the mean link delay time (tmld). The tmld is calculated from:

$$tmld=(t2-t1)+(t4-t3)/2 \quad\quad 135$$

Peer 1 105 knows the mean link delay time, the timing offset for Peer 2 110 can be calculated.

$$toffset=t2-t1-tmpd=100-600-75=-575 \quad\quad 150$$

Figure 2:
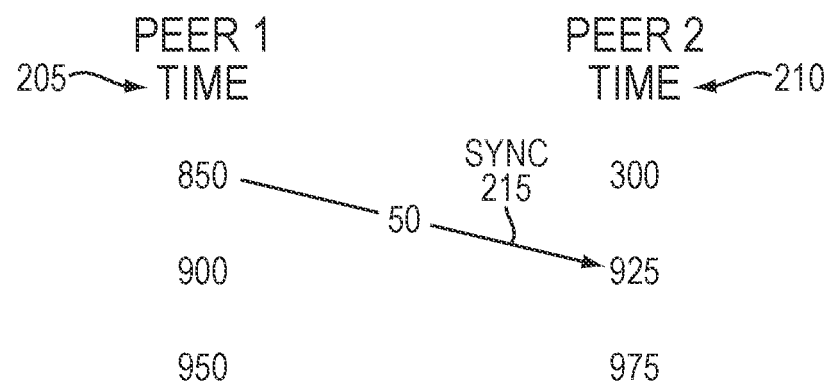

Refer now to the example embodiment of FIG. 2. Peer 1 205 sends Peer 2 210 the offset using a Sync packet 215. Peer 2 210 then uses the offset to update its local time by subtracting the offset from its local time.

Figure 3:
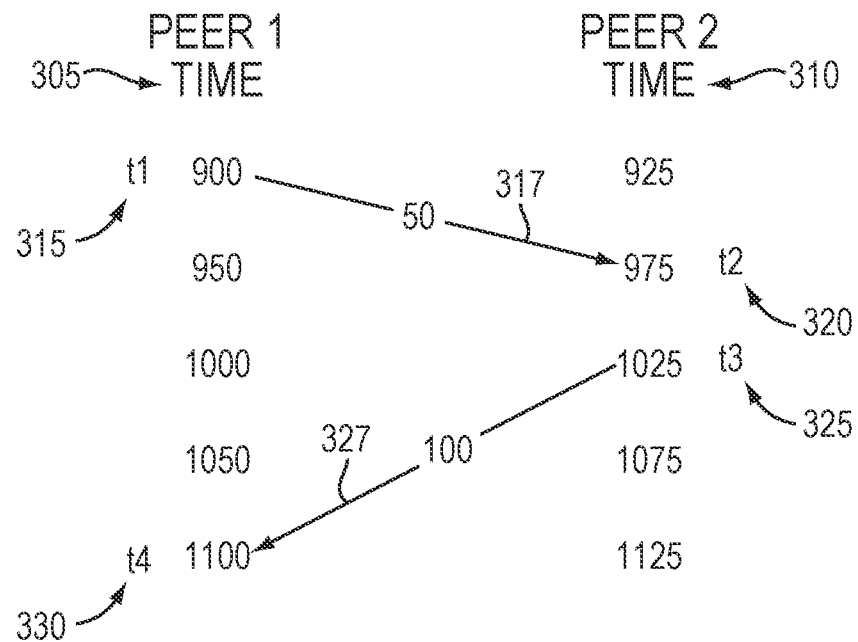

Refer now to the example embodiment of FIG. 3, which illustrates a second execution round for synchronizing two clocks. Tmpd is still 75 time units, however, the toffset is deemed to be zero. As such, the two peers are considered to be in sync.

However, in these embodiments, if the actual Time units in both Peer 1 305 and Peer 2 310 are compared, the two clocks are not time synchronized. In these embodiments, there is an offset of 25 Time units. In these embodiments, the offset is caused by the fact the transmission time between Peer 1 305 and Peer 2 310 in the two directions is not symmetrical. That is, in these embodiments a message from Peer 1 305 to Peer 2 310 takes a different amount of time than a message sent from Peer 2 310 to Peer 1 305. In most embodiments, asymmetry in communications may case an inaccuracy in the PTP protocol.

In many embodiments, synchronization may cause problems with synchronizing peers. In certain embodiments, as shown in the example embodiments of FIGS. 1-3, mean peer delay, tmpd=(t2−t1)+(t4−t3)/2, may need to have symmetric delays in order for the PTP algorithm to work effectively. In many embodiments, if delays between peers are not symmetric, then it may be necessary to know a delay in one direction in order to infer (learn) the delay in the opposite direction.

In some embodiments, propagation delay in one direction may be assumed equal to the propagation delay in the other direction. Typically, with the type of optical information on either side of an optical link, it may be assumed that TX1==TX2 and RX1==RX2 such that (TX1+RX2)==(TX2+RX1) would be true. Conventionally, it may be expected that each time the systems turn up, the delays would be the same. Generally, if delay from a first transceiver to a second transceiver and back from the second transceiver to a first transceiver was the same, then a PTP algorithm should work to synchronize clocks of the first and second transceiver. In many embodiments, the current disclosure has realized that if delay was different, then a PPT algorithm may fail to correctly synchronize clocks.

Figure 4:
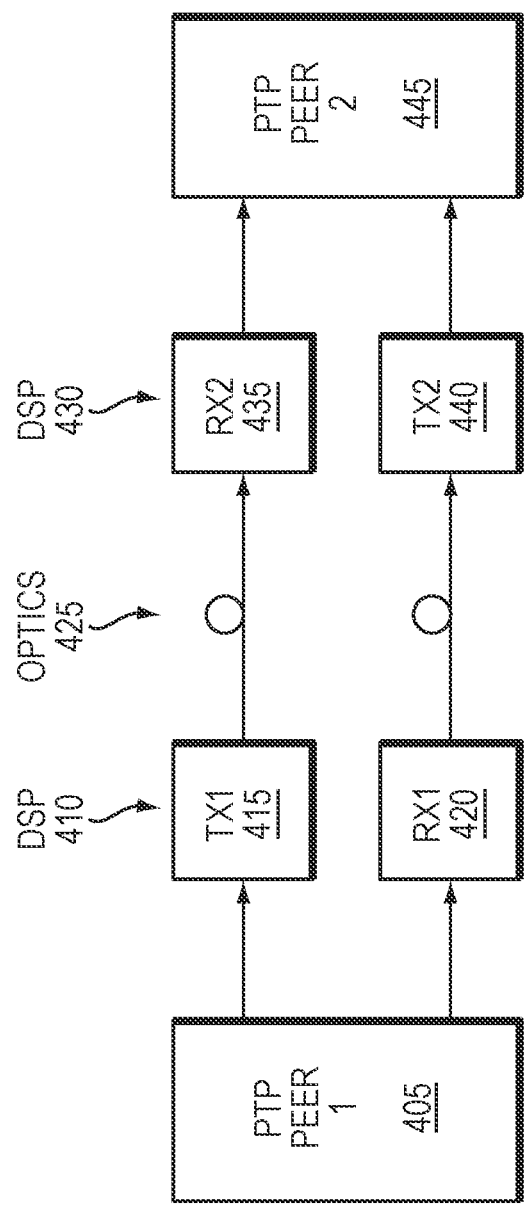
FIG. 4 is a simplified illustration of a communication system, according to an embodiment of the current disclosure.

Refer now to the example embodiment of FIG. 4, which illustrates an example embodiment of a communication system with clocking delays. In the example embodiment of FIG. 4, PTP Peer 1 405 sends information to DSP 410, which has TX1 415 (transmitter) and RX1 420 (Receiver). Information is sent to TX1 415 and continues through optics 425 to RX2 435 of DSP 430. DSP 430 also has TX 2 440. Information proceeds from RX2 435 to PTP Peer 2 445. Information sent form PTP Peer 2 445, proceeds to TX 440 in DSP 430, across optics 425, to receiver 420 of DSP 410 to PTP Peer1 405. Each element, such as element TX1 415, Tx2 440, RX1, 420, and RX2 435 may input different amounts of delay. The delay added by each element may be different when information is being transmitted from PTP Peer1 405 to PTP Peer 2 445 than when a transmission happens in reverse. However, to apply the tmpd equation to the example embodiment of FIG. 4, it may be necessary to satisfy this equation (TX1+RX2)==(TX2+RX1).

In most embodiments, the current disclosure has realized that transmission delay from a first transceiver to a second transceiver may not be the same as transmission delay from the second transceiver to the first transceiver. In many embodiments, the equation (TX1+TX2)==(TX2+RX1) may not be true. In certain embodiments, delay variation on turn-up for TX, RX, or TX and RX may not be non-zero.

In almost all embodiments, Applicants have realized that for IEEE-1588 to work delay variation on TX and RX must be zero on all turn-ups. In many embodiments, for IEEE-1588 to work delay variation may need to be minimized to a value which is approximately <10 nS. In other embodiments, if the delay variation is non-zero, then the delay variation may need to be dynamically measurable (either RX or TX) and reported to a PTP peer such that the appropriate adjustments may be made.

Figure 5:
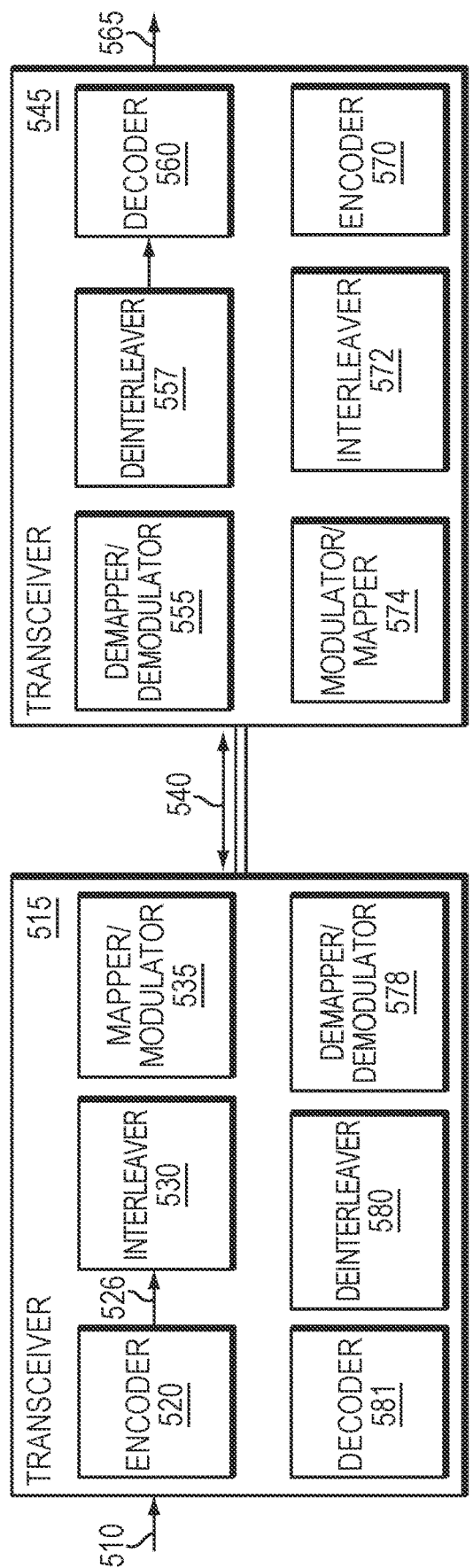
FIG. 5 is an alternative simplified illustration of a communication system, according to an embodiment of the current disclosure.

Refer now to the example embodiment of FIG. 5, which illustrates sample components in a transceiver that may cause delay in a communication system. FIG. 5 is a simplified example embodiment of an optical system with a link and two transceivers, each transceiver with an encoder, decoder, mapper modulator, decoder, demapper, and demodulator. In FIG. 5, optical transceiver 515 has encoder 520, interleaver 530 and mapper/modulator 535. As well, transceiver 515 has demapper/demodulator 578, deinterleaver 580, and decoder 581. In the example embodiment of FIG. 5, each functionality is shown as a separate box, however in alternative embodiments functionality may be combined or shared depending on design.

Referring back to the example embodiment of FIG. 5, encoder 520 receives input signal 510, Encoder 520 encodes input signal 510 to generate a plurality of bits 526. Interleaver 530 interleaves the bits. Mapper/Modulator 535 modulates light to send the plurality of signals across link 540 to transceiver 545.

Transceiver 545 has demapper/demodulator 555, deinterleaver 557, and decoder 560. Demapper/demodulator 555 receives the symbols from optical link 540. Demapper/demodulator 555 associates the received symbols with a plurality of bits and assigns to each bit a metric that indicates the probability that the transmitted bit was a 0 or a 1. Referring back to the example embodiment of FIG. 5, demapper/demodulator 555 provides the plurality of metrics to deinterleaver 557. Deinterleaver 557 deinterleaves the data. Decoder 560 decodes the metrics. Transceiver 545 also has encoder 570, interleaver 572 and mapper/modulator 574. Encoder 570, interleaver 572, and mapper/modulator 574 act in a similar manner to encoder 520, interleaver 530, and mapper/modulator 535 at Transceiver 515. Similarly, decoder 581, deinterleaver 580 and demodulator/demapper 578 of Transceiver 515 function similarly to demapper/demodulator 555, interleaver 557, and decoder 560 of transceiver 545. Each of the elements in transceivers 515 and 545 may inject delay into the communication system. In the example embodiment of FIG. 5, the delay may be different when information is transmitted from transceiver 515 than when information is transmitted to transceiver 515.

In many embodiments, the current disclosure has realized that there may be at least three potential resolutions to a problem that a roundtrip flight between peers may not be twice the time of a transmission from a first to a second peer. In some embodiments, a first solution may be to remove all delay variation may enable clock synchronization. In other embodiments, dynamically measuring delay may enable clock synchronization. In further embodiments, implementation of a local PTP peer may enable clock synchronization.

In some embodiments, removing delay variation may enable clock synchronization by enabling a same delay bidirectional delay between two transceivers. In most embodiments, this may require all delay variations in a DSP design to be removed. In some embodiments, it may be necessary to determine each location where a delay may be present.

In some embodiments, a SERDES may have delay. In most embodiments, a SERDES at a host interface provides for serial to parallel and parallel to serial conversion. In certain embodiments, serial to parallel or parallel to serial conversion may result in delay. In some embodiments, if a phase of a conversion moves from turn-up to turn-up, a delay variation may occur as a result.

In other embodiments, a lane deskew process in Ethernet and OTN applications may cause delay variation. In some embodiments, a deskew process may delay client traffic by an amount of delay for the lane which comes last in time. In many embodiments, a delay of client traffic may change from turn-up to turn-up and a delay variation may occur as a result. In some embodiments, a way to remove delay variation due to Lane Deskew may be to provide a mode which forces the deskew to the maximum amount of skew at all times. In some embodiments, maximizing the amount of skew may remove a delay variation at the expense of added latency (and RAM).

In many embodiments, there may be many FIFOs in a design required for proper operation of the pipeline. In most embodiments, if a number of entries used in various FIFOs changes from turn-up to turn-up, a delay variation may occur as a result. In further embodiments, there may be gear boxes in a data path used to convert between various bus widths throughout the data path. In many embodiments a gear boxes may result in some average phase difference between the conversion points. In other embodiments, a gear boxes may represents some amount of variable data storage. In certain embodiments, if a phase of a conversion moves from turn-up to turn-up, a delay variation may occur as a result.

In many embodiments, multiplexing modes may use a mapping procedure called Generic Mapping Procedure (GMP). In certain embodiments, GMP may occurs when mapping Ethernet into OTN or various OTN streams in OTUCn or even OTUCn into FLEXO. In some embodiments, a GMP process may introduce "jitter" in a data path that might show up and appear to cause delay variation in delivery of PTP packets.

In certain embodiments, to reduce delay variation due to GMP it may be possible to increase filtering (reduce the gain) of the GMP process. In some embodiments, reducing gain or increasing filtering may require deeper FIFOs to support the reduced gain. In many embodiments, a tradeoff to increasing filtering may be to lower delay variation at the expense of latency (and RAM).

In some embodiments, there may be various multiplexing stages in a data path. In many embodiments, each multiplexing stage may cause "jitter" in a data path that might show up and appear to cause delay variation in delivery of PTP packets. In some embodiments, a FEC interleaver process may cause some delay variation. In certain embodiments, a FEC interleaver may cause indeterminist phase offset between a multiplexing data plane and a DSP FEC data plane that might vary between turn-ups.

In some embodiments, a FEC deinterleaver process might cause some delay variation. In certain embodiments a FEC deinterlaver may cause indeterminist phase offset between the multiplexing data plane and a DSP FEC data plane that might vary between turn-ups. In many embodiments, a FEC decoding process may cause some delay variation. In particular embodiments, a decoding process may cause indeterminist phase offset between the multiplexing data plane and a DSP FEC data plane that might vary between turn-ups.

In other embodiments, delay variation may be necessary in a system. In many embodiments, if there is delay variation it may be beneficial to measure the delay on each turn-up and report the delay values to the edge PTP Peers such that adjustments can be made to a tmpd calculation accordingly. In some embodiments, it may be beneficial to dynamically measure a delay in hardware. In some embodiments, measuring dynamic delay in hardware at run-time may provide a local PTP Peer with an actual delay measurement to adjust the tmpd calculation to account for the delay for the current turn-up.

In many embodiments, a "marker" may need to be injected at some point in the beginning of a data path, its entry time recorded, then that marker may be examined at the end of the data path and record its exit time. In certain embodiments, a marker may be inserted at a SERDES RX serial input and may be extracted at a DAC output. In some embodiments, a marker may be inserted at a ADC input and extracted at a SERDES TX serial output.

In certain embodiments, a "mux" may be inserted at a SERDES RX input for the insertion of a "canned" alignment marker interval that would allow the Ethernet or OTN client to synchronize with the "canned" data stream to allow data to progress through the pipeline. In some embodiments, once a "canned" message were to get into OTN multiplexing and TX modem, it may be difficult to follow where the "marker" is in the data stream. In certain embodiments, it may be necessary to implement a full "demodulator" in a TX path in order to find a "marker." In other embodiments, after finding a marker, it may be necessary to factor in delay changes resulting from the Ethernet or OTN deskew process when real traffic is replaced. In certain embodiments, registers that report deskew delay might be useful in calculating delay.

In certain embodiments, a "mux" may be inserted close to a ADC as possible in a RX direction. In some embodiments, a "canned" alignment marker interval may be inserted that would allow the Ethernet or OTN traffic to progress through the RX modem (DSP frame), OTN multiplexer (OTN frame) and Client (more frames). In some embodiments, finding a "marker" at the output of a SERDES TX may be difficult. In certain embodiments, a good portion of the Ethernet or OTN client in the TX direction may need to be implemented to find a marker. In other embodiments, at an output of a SERDES TX, there may be a bit interleaved stream of many logical lanes.

In certain embodiments, a source and destination of a waypoint may be somewhere in the middle where points from the edge to a waypoint are deemed to have a fixed delay or could be readily determined based upon other means. In many embodiments, waypoints may be selected which cover the portion of a DSP design that had an inherent delay variance across turn-ups. In other embodiments, loopback testing may to determine delay may be used. In certain embodiments, a loopback with a same DSP or a remote loopback in a far end DSP may send a marker back to the receiver in the same DSP.

In some embodiments, a loopback path may not cover a delay for components that sit outside a loopback path. In certain embodiments, components that sit outside a loopback path may be those portions between a delay measurement tool and a SERDES or ADC/DAC, dependent on where the delay measurement tool is. In other embodiments, depending on a position of a delay measurement tools uncovered components may be positioned in an area with known fixed delay, or those delays may be measured or ascertained using other means.

Figure 6:
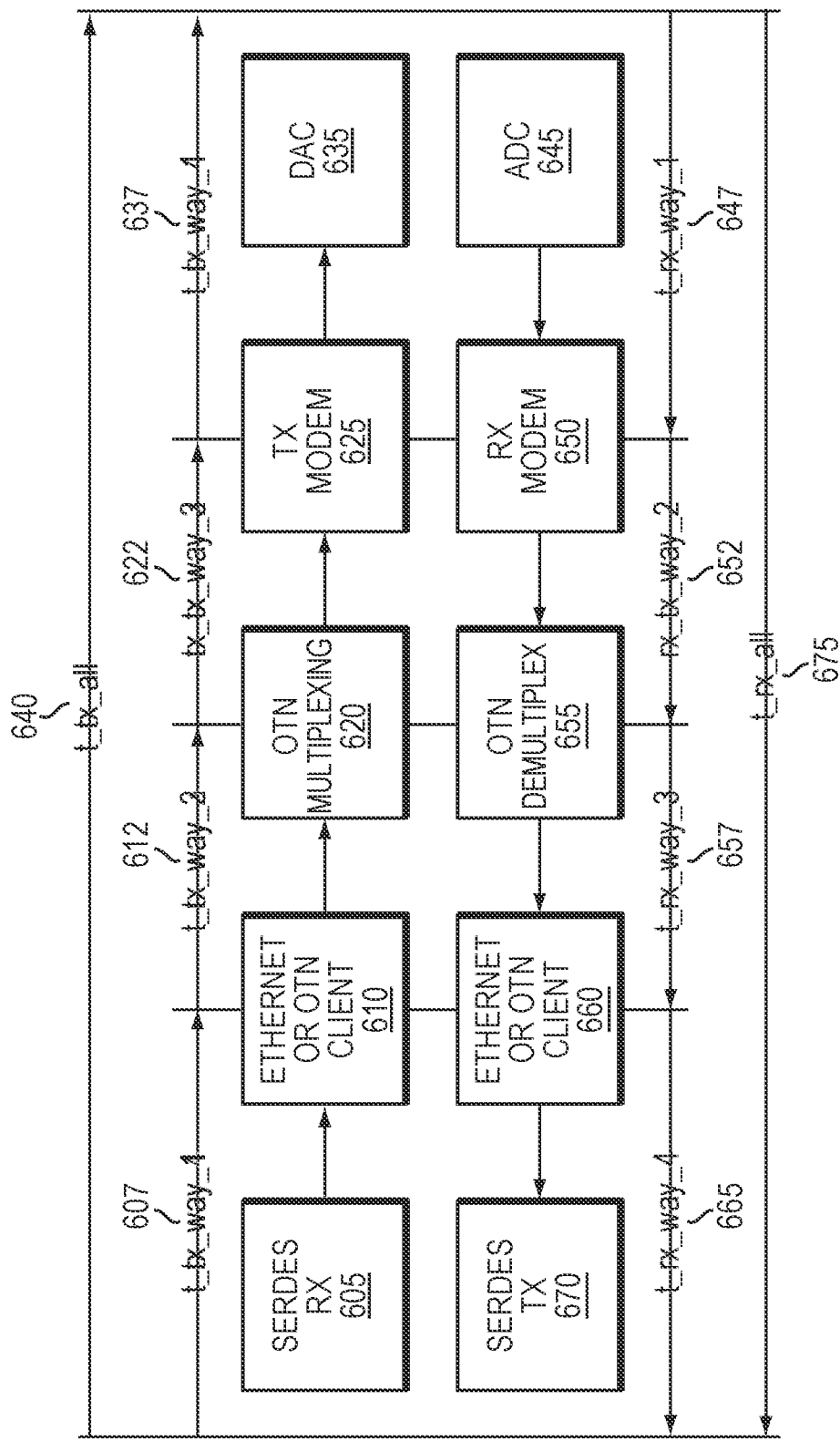
FIG. 6 is a simplified illustration of a communication system noting where delays can occur in the communication system, according to embodiments of the current disclosure.

Refer now to the example embodiment of FIG. 6, which illustrates a sample path for transmission through a transmitter portion of a transceiver and a sample path for a receive portion of a transceiver that may be used for measuring delay in hardware. In this example, there are "waypoints" that can be used to measure delay in a system. Serdes RX 605 has a path to ethernet or OTN client 610 and the path between them may be measured as t_tx_way_1 delay 607. Ethernet or OTN client 610 has a path to OTN multiplexing 620 and the delay between them may be measured as t_tx_way_2 612. OTN multiplexing 620 has path to TX modem 625 and the delay between them may be measured as tx_tx_way_3 622. TX modem 625 has path to DAC 635 and the delay between them may be measured as t_tx_way_4 637. The total delay across the transmitter (tx) may be measured as t_tx_all 640.

ADC 645 has path to RX modem 650 and the delay between the two may be measured as t_tx_way1 647. RX modem 650 has path to OTN demultiplex 655 and the delay between the two may be measured as rx_tx_way_2 652. OTN Demultiplex 655 has path to ethernet or OTN client 660 and the delay between the two may be measured as t_rx_way_3 657. Ethernet or OTN client 660 has path to Serdes TX 670 and the delay between the two may be measured as t_rx_way_4 665. The total delay on the receiver (rx) may be measured as t_rx_all 675. In some embodiments, a "marker" probe may be sent out using some circuit in the Ethernet or OTN client logic. In other embodiments, a marker may be sent out at each waypoint. In further embodiments, a waypoint may stamp a received maker to record what time each waypoint received the marker.

In a particular example, consider a PM delay path measurement defined for OTN in the G.709 standard. In the particular example, it may be possible to execute a loopback path to calculate a delay from an OTN transmitter back to a corresponding OTN receiver in a same chip. In this particular example, a delay measurement may be accurate, down to a single clock cycle. In other embodiments, using loopback to measure delay may be problematic.

In some embodiments, delay measurement may cover a round-trip delay and not a unidirectional delay. In most embodiments, the equation (TX1+RX2)==(TX2+RX1). If (TX1 !=TX2) or (RX1 !=RX2) needs to be satisfied so a round trip delay measurement may be meaningless. In most embodiments, if two different pieces of vendor hardware are used it is very likely TX1 !=TX2 or RX1 !=RX2. In other embodiments, for equipment of the same vendor, there may not be a guaranteed that TX delay is the same for each turn-up and RX delay is the same for each turn-up. In almost all embodiments, if any delay changes, then a round trip measurement may not be helpful.

In other embodiments, TX and RX delay may be measured in verification. In certain embodiments, measuring delay in verification may help to determine if there is delay variation. In many embodiments, if delay variation exists, using waypoints and measurements may help determine where the delay variations are occurring. In some embodiments, if delay variation is nonexistent, DV simulation results may be used to extract actual delay times for both TX and RX, separately, for all the various modes. In certain embodiments, PTP Peers may use measured delays for determining accurate tmpd and toffset values. In some embodiments, performing a verification analysis may require a verification infrastructure in order to be able to timestamp markers as they enter/exit a DSP or enter/exit various waypoints along the way.

In some embodiments, a local PTP Peer within a DSP may help with clock synchronization. In certain embodiments, a local peer may allow a DSP to synchronize its local time of day clock to a local Peer. In many embodiments, a local DSP time of day may be used to synchronize a remote PTP Peer downstream. In most embodiments, a local PTP Peer within a DSP may need to be implemented in areas which have access to PTP packet streams. In some embodiments, a local peer may be implemented in a Ethernet block that can extract/insert PTP packets at a MAC layer.

In other embodiments, a local peer may be implemented in an OTN Multiplexer/Demultiplexer block that can extract/insert PTP packets over a OSMC channel that rides in an 400ZR/OpenROADM layer. In some embodiments, external PTP Peers may be facing. In certain embodiments, if a round trip delays between a local PTP Peer in a DSP are not evenly balanced with a next remote PTP Peer, then proper clock synchronize in a DSP may not occur. In most embodiments, there may be a need to implement timestamping in the design verification arena to help identify two points.

In many embodiments, it may be necessary to determine if there is delay variation. In other embodiments it may be necessary to determine the source of delay variation. In some embodiments there may be no delay variation. In other embodiments, if there is delay verification, it may be beneficial to identify and account for the delay verification. In further embodiments, delay variation may be limited to either the TX or RX side. In certain embodiments, were delay variation is limited to a TX or RX side, a loopback test may determine another delay value since one of the delay values is fixed. In further embodiments, it may be necessary to find that delay variation in both the TX and RX sides and that neither side can be resolved.

In many embodiments, certain DSPs may have a capability to insert a timestamped SYNC packet in an Ingress datapath and detect/timestamp a SYNC packet in an Egress datapath. In some embodiments, a host may need to have an ability to insert a timestamped SYNC packet on Egress and detect/timestamp a SYNC packet on Ingress. In certain embodiments, SYNC packet insertion/detection path itself may need to have no delay variation.

In some embodiments, a DSP may have a timestamp/TOD counter that may be synchronized, both in phase and frequency, to a Host TOD counter. In some embodiments, frequency may be synchronized by a Host receiving a PTP_CLK and SERDES Tx reference clock from the Board-level Network Timing circuit, configuring clocks such that the Egress GAUI datastream is timed to the PTP clock domain, synchronizing GAUI and Host TOD counters. In certain embodiments a DSP may have a capability to recover a clock from a System-side Egress (Tx) serdes and use it internally to generate a clock for the TOD counter. In most embodiments, a Host TOD counter and a DSP TOD counter may be frequency-locked.

In certain embodiments, phase may be synchronized by a Host Network Timing logic producing a pulse-per-second (PPS) signal that is used to align TOD counters around the system, the signal is sent to counters using closely-matched etch, taking internal device delays into account. In many embodiments, a rising edge of a signal may be used to assure the "seconds" field of the TOD counters are aligned. In some embodiments, a value of a counter may be loaded over the control plane interface and latched on the rising edge of PPS. In certain embodiments, a PPS signal may be provided to a DSP using some available spare I/O pin through a module connector.

In certain embodiments, a packet walk through may include one or more of the following:

1. A SYNC packet may be injected in an Egress datapath by a Host. The SYNC packet may be automatically timestamped by hardware at a periphery of the Host (T1), using a value from a local TOD counter.
2. A SYNC packet may be received by a DSP SYNC packet detect logic. A local TOD counter may be used to compare T2 to a local TOD count (T1). A difference may be stored in a local register to be read by the Control Plane processor. A calculated difference may represent an Egress System-side delay.
3. With no real/normal traffic flowing, a canned SYNC packet may be injected into an Ingress datapath by logic in a DSP towards a Host. A SYNC packet may have a timestamp (T3) from a TOD counter at the exact time of insertion.
4. A SYNC packet may be received by a Host. SYNC packets may be automatically timestamped by hardware (T4) at a periphery of a Host. A host's microcode may compare two timestamps (T4–T3) and store a difference in a local register, accessible by a control plane processor. This difference may represent Ingress System-side delay.
5. With no real/normal traffic flowing, a canned SYNC packet may be injected into an Egress datapath by a DSP Ethernet logic in an Egress line-side direction.
6. A SYNC packet may be received by a DSP line-side logic, close to a DAC interface. The DSP may compare two timestamps (T6–T5) and store a difference in a local register, accessible by a control plane processor. This difference may represent an Egress line-side TX delay.
7. A line-side TX to RX loopback may be configured. With no real/normal traffic flowing, a canned SYNC packet may be injected into an Egress datapath by a DSP Ethernet logic in an Egress line-side direction.
8. A SYNC packet may be received by a DSP Ethernet logic. A DSP may compare two timestamps (T8–T7) and stores a difference in a local register, accessible by a control plane processor. This difference may represent an Egress line-side TX+line-side RX delay.

In some embodiments, a PTP sync packet (or other marker) may be extracted from a DSP data stream close to a DAC.

In an embodiment, if an extraction point is close to a DAC, a data stream may contain a serial stream of DSP symbols. In this embodiment it may be hard to extract a PTP sync packet from this data stream. In this embodiment, a PTP sync packet information may have been more than likely slice and diced into a multiplexed frame structure. In this embodiment, a multiplexed frame structure may have been interleaved and further segmented into FEC code words. In this embodiment, a FEC code words may be converted to symbol format and dispersed into some DSP framing structure. In this embodiment, to dissect the information in this stream would require a full DSP demodulator.

Figure 7:
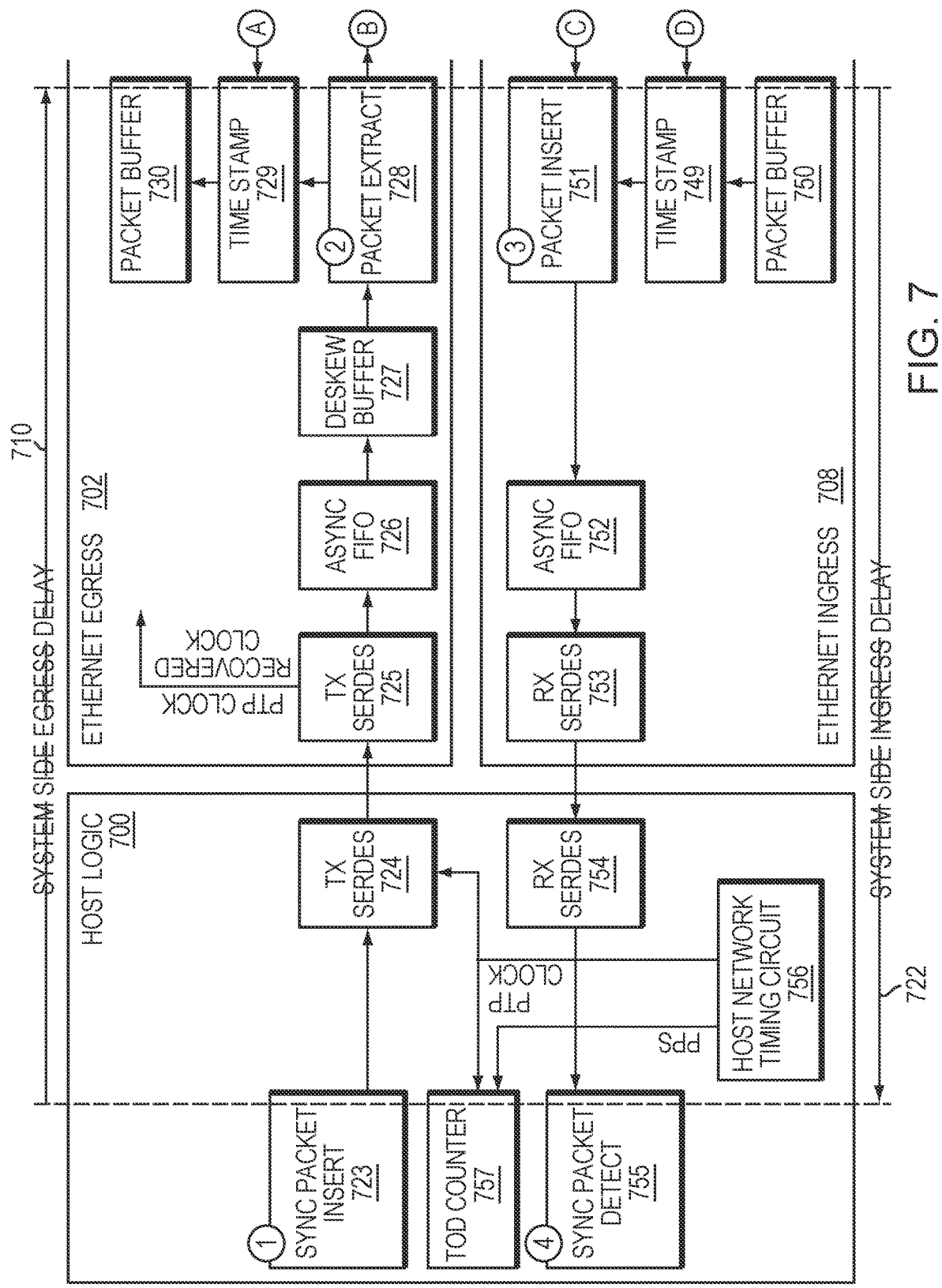
FIG. 7 is a simplified illustration of a communication system with points to inject a synchronization packet to measure delays in the communication system, according to embodiments of the current disclosure.
Figure 7:
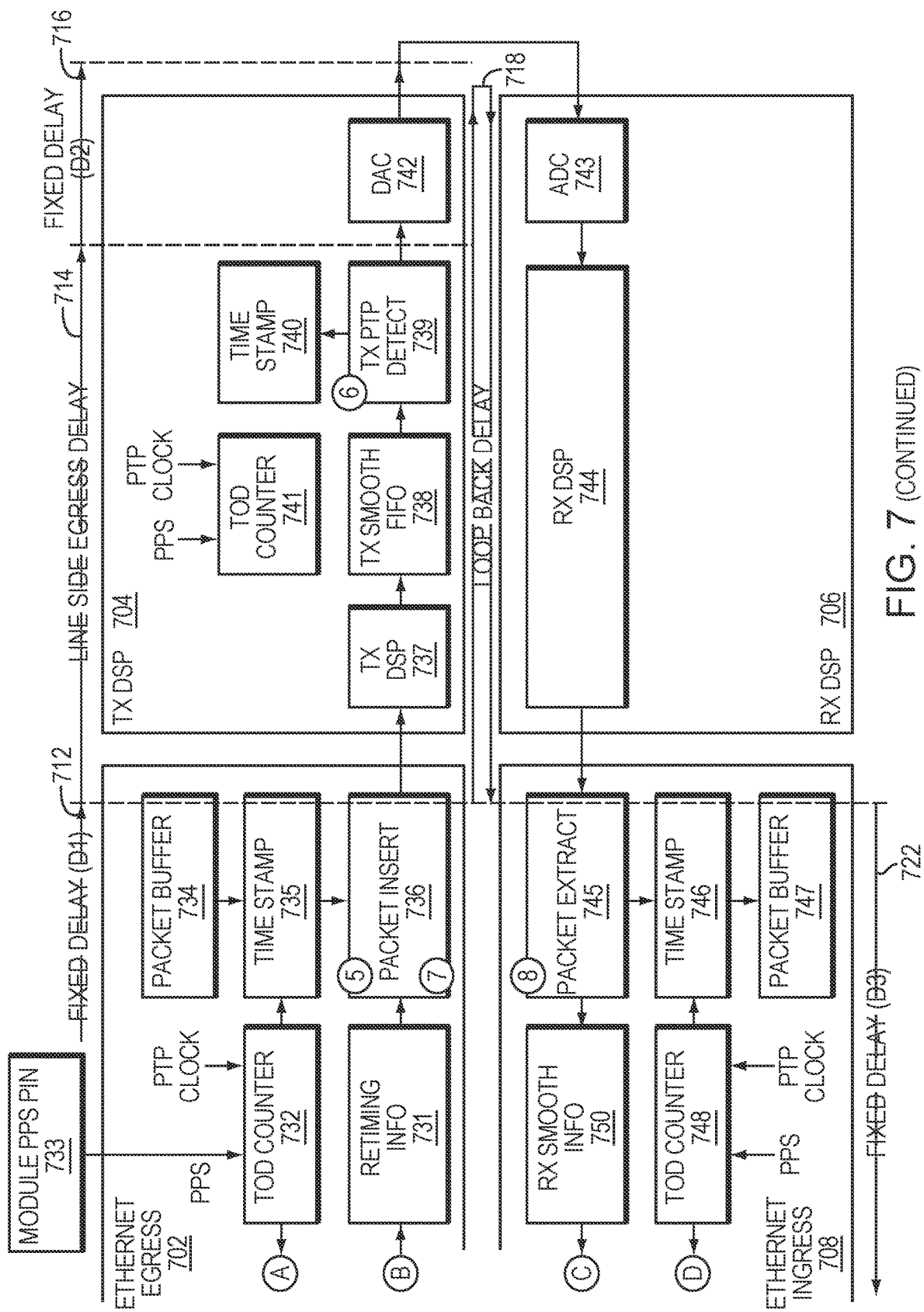

Refer now to the example embodiment of FIG. 7, which illustrates an example communication system and where delays in the communication system may occur. In FIG. 7, there is host logic 700, which is connected to Ethernet Egress 702, which is connected to TX DSP 704, which is connected to RX DSP 706, which is connected to Ethernet ingress 708, which is connected to Host Logic 700. In this example embodiment, there is a system side egress delay 710. There is a fixed delay 712 in ethernet egress 702. There is line side egress delay 714. There is a fixed delay 716 in TX DSP 704. There is loopback delay 718. There is fixed delay 720 in Ethernet ingress 708. There is system-side ingress delay 722. In FIG. 7, each element may add a different delay.

Figure 8:
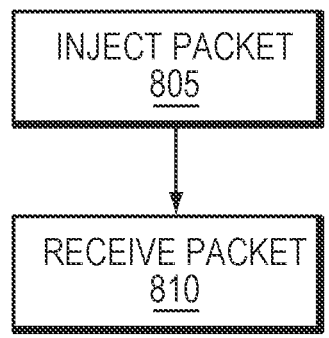
FIG. 8 is a simplified method of measuring delays in a communication system, according to embodiments of the current disclosure.

Refer now to the example embodiments of FIGS. 7 and 8, which illustrate injecting and removing packets into a communication system. A SYNC packet is injected in the Egress datapath by the Host (step 805). A SYNC packet may be automatically timestamped by hardware at a periphery of the Host (T1) 700, using a value from a local TOD counter 757. The Sync packet travels from sync packet insert 723 to TX serdes 724 to tx serdes 725 to async fifo 726 to deskew buffer 727 to Packet extract 728. Packet extract 728 may remove the SYNC packet and time stamp it (step 810).

A SYNC packet may be inserted by packet insert 736. Sync packet is transmitted to TX smooth FIFO 738 to TX PTP Detect 739. SYNC packet may be time stamped by time stamp 740. TX PTP Detect 739 sends SYNC packet to DAC 742. DAC 742 transmits packet to ADC 743 to RX DXP 744. SYNC packet continues from RX DSP 744 to packet extract 745. Time stamp 746 time stamps SYNC packet. SYNC packet is inserted by packet insert 751. SYNC packet continues to ASYNC 752 to RX SERDES 753. SYNC packet continues to RX SERDES 754 to SYNC Packet detect 755.

In some embodiments, a DSP may have a capture buffer that can record a window of DSP symbols over a short time period. In certain embodiments, a size of a DSP buffer may determine a maximum number of symbols to be collected. In many embodiments, a DSP capture buffer may be located close to a DAC and/or ADC blocks within a DSP.

In many embodiments, capturing DSP symbols may enable extraction of a PTP sync packet (or other marker) to identify the synchronized time of when the marker arrives at the DAC (or ADC) point in the DSP. In some embodiments, there may be a straightforward deterministic means to calculate the delay difference between the DAC (or ADC) capture point and the external DSP signaling interface.

In some embodiments, use of a target event plus a programmable trigger delay may allow for the target event to "land" within the DSP capture buffer. In certain embodiments, a target event may land towards an end of a capture buffer in order to maximize potential success of finding the target event. In many embodiments, when a DSP capture buffer begins gathering DSP symbols, a synchronized TOD clock may be captured in a storage buffer that is accessible to a control plane. In some embodiments, a time stamp may enable understanding of the time stamp of every symbol in a DSP capture buffer since each symbol is a known delay relative to the time stamp value.

In many embodiments, when a DSP capture buffer is complete, the capture buffer may be processed using a software algorithm that implements a DSP demodulator. In certain embodiments, processing of a capture buffer may result in a serial stream of bits. In some embodiments, a software process may inspect a serial stream of bits in order to find a PTP SYNC packet (or other marker). In many embodiments, a synchronized time of a PTP SYNC packet extraction may be calculated using a synchronized time stamp of a start of a DSP capture buffer plus an offset of a detected marker relative to the beginning of the DSP capture buffer.

In many embodiments, DSP demodulation software application may be too large and cumbersome to execute on an embedded CPU found in the DSP. In some embodiments, a DSP capture buffer contents may need to be off loaded to an external CPU found in a host platform that utilizes the DSP device. In some embodiments, it may not be guaranteed that a desired marker may be found in a DSP capture buffer. In certain embodiments, it may be necessary to change a Trigger Delay value to ensure that a marker lands in a DSP capture buffer. In further embodiments, iterations may be required to find a useful Trigger Delay value.

In some embodiments, an ability for demodulation software application to find a marker may be predicated on some other framing information also included in the DSP capture buffer. In certain embodiments, if a DSP is performing multiplexing of multiple client streams, then a client stream framing structure may need to be found in order to segregate the data between clients. In many embodiments, DSP framing information may need to be found in order to decipher which symbols are DSP overhead and which symbols are traffic. In certain embodiments, there may be a need for a DSP and multiplexing information to be properly ordered within a DSP buffer in order for a DSP demodulation algorithm to be successful on any given DSP capture buffer sample. In many embodiments, multiple DSP capture cycles may be required in order to find a successful "hit." In some embodiments, a "hit" may refer to an ability to find a marker event in a DSP capture buffer.

Figure 9:
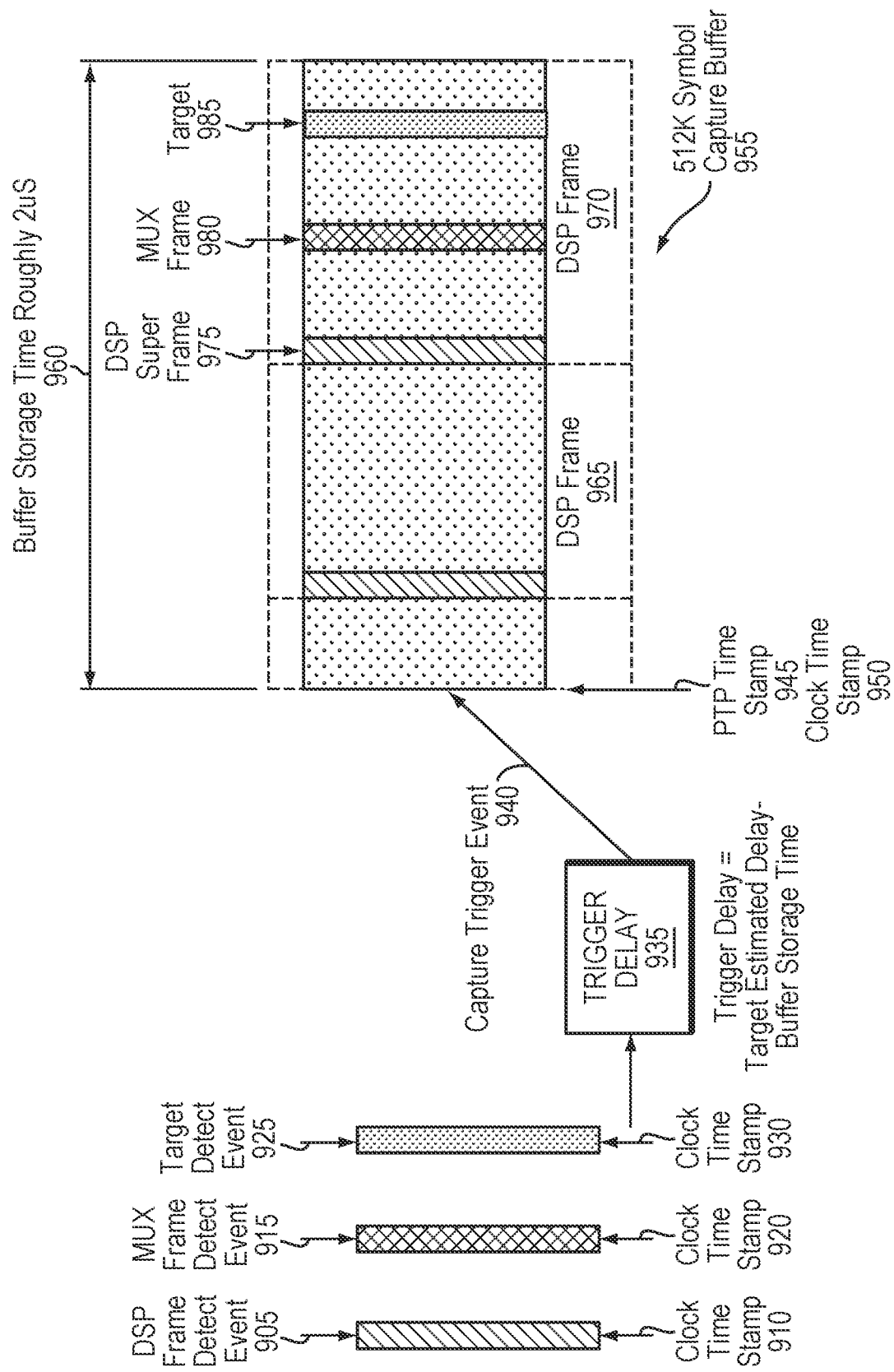
FIG. 9 is a simplified illustration of capture events for a synchronization packet and a symbol capture buffer for extracting the synchronization packet from the communication system, according to embodiments of the current disclosure.

Refer now to the example embodiment of FIG. 9, which illustrates a sample capture buffer and trigger event. A detect event, such as DSP Frame Detect event 905 with clock time stamp 910, MUX frame detect event 915 with time stamp 920, or target detect event 925 with clock time stamp 930 may occur. A detect event may create trigger delay 935, which may be equal to a target estimated delay minus buffer storage time. Capture trigger event 940 occurs which results in buffer symbols being buffered in 512 k Symbol Capture Buffer 955, where the time of the capture is Buffer storage time 960 or roughly 2 uS. In Symbol Capture Buffer 955 are DSP frame 965 and DSP frame 970. DSP Frame 970 has DSP super frame 975, MUX frame 980, and target data 985. In this example embodiment, target data 985 may be extracted from symbol capture buffer 955. In a particular embodiment, given a capture trigger event, such as capture trigger event 940, data is stored in a symbol capture buffer, such as symbol capture buffer 955, and target data corresponding to a sync packet may be removed from the symbol capture buffer.

In some embodiments, a PTP SYNC packet may be sent from a reference point, such as reference point #1 as shown in the example embodiment of FIG. 7, and may be able to identify when the PTP SYNC packet crosses a DAC (or ADC) reference point while capturing a synchronized TOD value at that reference point. In certain embodiments, a difference between a capture TOD value and a time stamp in a PTP SYNC packet may accurately represents a delay between reference points.

In many embodiments, a DSP may have a means to create a trigger event that may cause a capture buffer to store a serial stream of DSP symbols for a small window of time. In many embodiments a capture trigger may be created using a target event reference point. In some embodiments, a target event may be either a PTP SYNC packet or Ethernet Alignment Marker as this marker crosses reference point such as reference point #2 in the example embodiment of FIG. 7.

The example embodiment of FIG. 9 may enable an increased likelihood that a DSP capture buffer contains necessary pieces for the DSP demodulation algorithm to be successful. In some embodiments, before a Capture Trigger event occurs, a DSP may be gathering local clock time stamp information for the various DSP and MUX framing events that cross the reference point before the DSP modulator. In certain embodiments, when a Capture Trigger event occurs, a time stamp gathering for the DSP and MUX frame events may freeze. In many embodiments, a DSP embedded processor may inspect the local time stamp values for the DSP, MUX, and Trigger events. In many embodiments, a time stamp order may be analyzed to find a likely candidate for processing. In some embodiments, a DSP embedded processor may perform hundreds or thousands of DSP capture cycles hunting for a likely candidate to be post processed by the HOST processor.

In certain embodiments, a total Egress TX delay may be calculated by a sum of Egress system-side delay plus Fixed Delay D1, plus Egress line-side delay plus Fixed Delay D2. In many embodiments, a total ingress RX delay may be inferred by Ingress system-side delay plus Fixed Delay D3, plus loopback delay, minus Egress line-side delay, minus Fixed Delay D2.

In some embodiments, a SYNC packet received by a DSP Ethernet logic may have jitter concerns. In other embodiments it may be necessary to deal with Skew Delay in Fiber cabling between remote ends. In some embodiments, BIDIR fiber may be used to compensate skew delay in fiber cabling. In certain embodiments, 5 nS PTP V2 requirements may be difficult. In other embodiments, it may be necessary to determine system clock accuracy of 400 Mhz (2.5 nS), 800 Mhz (1.25 nS).

In many embodiments, the techniques described herein may be performed and/or stored on a computer, a processor, and other types of integrated circuits or specially designed circuits. In some embodiments, the techniques herein may be stored on firmware or computer readable medium such as hard drives, RAM, and memory. In other embodiments, the techniques herein may be part of a generalized computing device or a specialized computing device. In certain embodiments, the current techniques may be used with fiber optic communication. In some embodiments, an encoder may be on a source side of a fiber optic communication system. In certain embodiments, a decoder may be on a receiving side of a fiber optic communication. In many embodiments, a source side of a fiber optic communication system may send a light wave to a receiving side. In certain embodiments, a fiber optic communication system may use one or more of the techniques described herein.

In some embodiments, one or more of the embodiments described herein may be stored on a computer readable medium. In certain embodiments, one or more of the embodiments described herein may be embodied in a computer program product that may enable a processor to execute the embodiments. In many embodiments, one or more of the embodiments described herein may be executed on at least a portion of a processor.

In most embodiments, a processor may be a physical or virtual processor. In other embodiments, a virtual processor may be spread across one or more portions of one or more physical processors. In certain embodiments, one or more of the embodiments described herein may be embodied in hardware such as a Digital Signal Processor DSP. In certain embodiments, one or more of the embodiments herein may be executed on a DSP. One or more of the embodiments herein may be programed into a DSP. In other embodiments, one or more of the techniques herein may be fabricated in a DSP. In some embodiments, a DSP may have one or more processors and one or more memories. In certain embodiments, a DSP may have one or more computer readable storages. In many embodiments, a DSP may be a custom designed ASIC chip. In other embodiments, one or more of the embodiments stored on a computer readable medium may be loaded into a processor and executed.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

The terms "approximately" and "about" may be used to mean within ±20% of a target value in some embodiments, within ±10% of a target value in some embodiments, within ±5% of a target value in some embodiments, or within ±2% of a target value in some embodiments. The terms "approximately" and "about" may include the target value.

What is claimed is:

1. A method for determining delay between clocks of a first coherent transceiver and a second coherent transceiver in a coherent optical system, the method comprising:
   in response to a trigger event, buffering digital signal processor (DSP) symbol information in a symbol capture buffer of the first coherent transceiver; wherein the amount of DSP symbol information buffered corresponds to the amount of symbols captured during a buffer storage interval;
   extracting a synchronization packet from the symbol capture buffer; wherein the symbol capture buffer is located within a coherent optical DSP of the first coherent transceiver; and
   calculating a total Egress TX delay by summing an Egress system-side delay, a Fixed Delay D1, Egress line-side delay, and Fixed Delay D2.

2. The method of claim 1 wherein the buffer storage time is approximately 2 us.

3. The method of claim 1 further comprising using the synchronization packet to set a clock on a peer.

4. The method of claim 1 wherein the synchronization packet has a timestamp.

5. The method of claim 4 wherein the timestamp is used to determine delay in a transmission line.

6. The method of claim 5 wherein the buffer storage interval depends on a number of symbols to be collected in the capture buffer.

7. A system for determining delay between clocks of a first coherent transceiver and a second coherent transceiver in a coherent optical system, the system comprising:
   a symbol capture buffer; wherein the symbol capture buffer is enabled to storage symbols received during a buffer storage interval; wherein the symbol capture buffer is located within a digital signal processor (DSP) of a first coherent transceiver; and
   logic; wherein the logic is enabled to extract a synchronization packet from the symbol capture buffer and calculate a total Egress TX delay by summing an Egress system-side delay, a Fixed Delay D1, Egress line-side delay, and Fixed Delay D2.

8. The system of claim 7 wherein the buffer storage interval is approximately 2 us.

9. The system of claim 7 wherein the logic is further enabled to use the synchronization packet to set a clock on a peer.

10. The system of claim 7 wherein the synchronization packet has a timestamp.

11. The system of claim 10 wherein the timestamp is used to determine delay in a transmission line.

12. The system of claim 11 wherein the buffer storage interval depends on a number of symbols to be collected in the capture buffer.

13. The system of claim 12 wherein the number of symbols to be collected is determined by an amount of symbols needed to be captured to find the synchronization packet.

14. The method of claim 6 wherein the number of symbols to be collected is determined by an amount of symbols needed to be captured to find the synchronization packet.

15. A coherent optical system apparatus comprising:
   a symbol capture buffer; wherein the symbol capture buffer is enabled to storage symbols received during a buffer storage interval; wherein the symbol capture buffer is located within a digital signal processor (DSP) of a first coherent transceiver; and
   logic; wherein the logic is enabled to extract a synchronization packet from the symbol capture buffer of the DSP and calculate a total Egress TX delay by summing an Egress system-side delay, a Fixed Delay D1, Egress line-side delay, and Fixed Delay D2.

16. The apparatus of claim 15 wherein the buffer storage interval depends on a number of symbols to be collected in the capture buffer.

17. The apparatus of claim 16 wherein the number of symbols to be collected is determined by an amount of symbols needed to be captured to find the synchronization packet.

18. The apparatus of claim 17 wherein the logic is further enabled to use the synchronization packet to set a clock on a peer.

19. The apparatus of claim 18 wherein the synchronization packet has a timestamp.

20. The apparatus of claim 19 wherein the timestamp is used to determine delay in a transmission line.

* * * * *